United States Patent [19]

Miwa

[11] Patent Number: 5,232,861
[45] Date of Patent: Aug. 3, 1993

[54] METHOD OF MANUFACTURING SEMICONDUCTOR DEVICE INCLUDING A BIPOLAR TRANSISTOR

[75] Inventor: Hiroyuki Miwa, Kanagawa, Japan

[73] Assignee: Sony Corporation, Tokyo, Japan

[21] Appl. No.: 751,080

[22] Filed: Aug. 28, 1991

[30] Foreign Application Priority Data

Aug. 31, 1990 [JP] Japan .................................. 2-231871

[51] Int. Cl.$^5$ .............................................. H01L 21/328
[52] U.S. Cl. ................................. 437/31; 437/162; 437/238; 437/200
[58] Field of Search ............... 437/31, 32, 33, 162, 437/195, 937, 238, 200; 148/DIG. 26; 257/588, 755

[56] References Cited

U.S. PATENT DOCUMENTS

| | | | |
|---|---|---|---|
| 4,356,622 | 11/1982 | Widmann | 437/200 |
| 4,495,512 | 1/1985 | Isaac et al. | 437/31 |
| 4,693,782 | 9/1987 | Kikuchi et al. | 437/31 |
| 4,789,648 | 12/1988 | Chow et al. | 437/195 |
| 4,808,542 | 2/1989 | Reichert et al. | 437/20 |
| 4,866,000 | 9/1989 | Okita | 437/31 |
| 5,010,026 | 4/1991 | Gomi | 437/162 |
| 5,024,957 | 6/1991 | Harame et al. | 437/31 |
| 5,037,768 | 8/1991 | Cosentino | 437/31 |

OTHER PUBLICATIONS

Murarka, S. P., Silicides for VLSI Processing, Academic Press, 1983, pp. 133-147.
Wolf, S., et al., Silicon Processing, vol. 1, 1986, pp. 395-397, pp. 182-191.
Kikuchi, K., et al., "A High Speed Bipolar LSI . . . ", IEEE IEDM 1986, pp. 420-423.

Primary Examiner—T. N. Quach
Attorney, Agent, or Firm—Hill, Steadman & Simpson

[57] ABSTRACT

The present invention is directed to a method of manufacturing a semiconductor device which comprises the steps of forming an opening portion through a polycide film and an insulating film sequentially formed on a semiconductor substrate of a first conductivity type so as to expose the semiconductor substrate, forming an insulating film on the side surface of the opening portion and the surface of the semiconductor substrate implanting an ion of a second conductivity type into the semiconductor substrate through the insulating film, and forming an insulating side wall in the opening portion. Thus, a metal pollution or the like in the active region due to a metal included in the polycide film can be prevented and a semiconductor device of high performance and high reliability can be manufactured. Also, the present invention is directed to a method of manufacturing a semiconductor device which comprises the steps of laminating two kinds of insulating films on a semiconductor substrate, forming a stepped opening portion for contact composed of a first opening portion through which the semiconductor substrate is exposed and a second opening portion, communicating to the first opening portion, formed by selectively removing only the upper insulating film, and burying a conductor in the stepped opening portion. Therefore, the contact widths can be reduced more and as a consequence, a semiconductor device of high performance and high reliability can be manufactured.

2 Claims, 16 Drawing Sheets

F I G. 5A
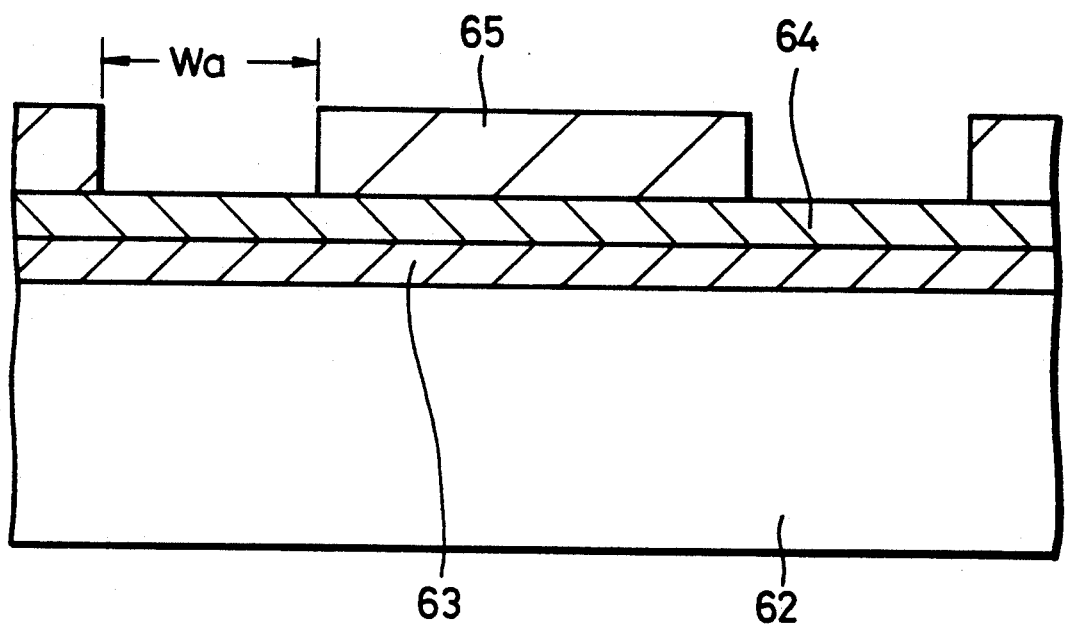
F I G. 5B
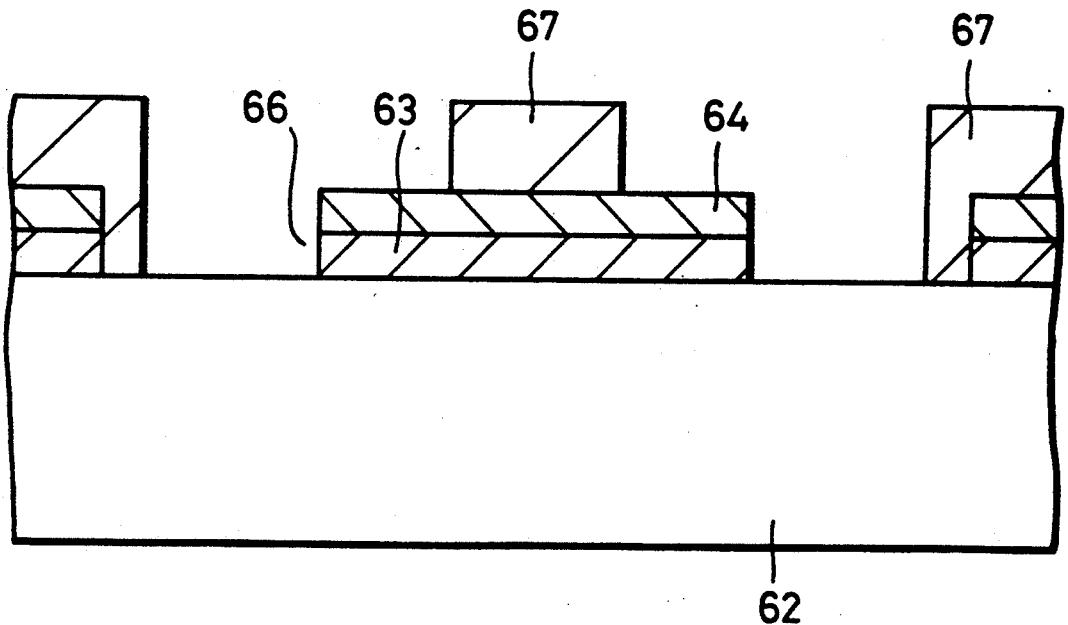

F I G. 5C
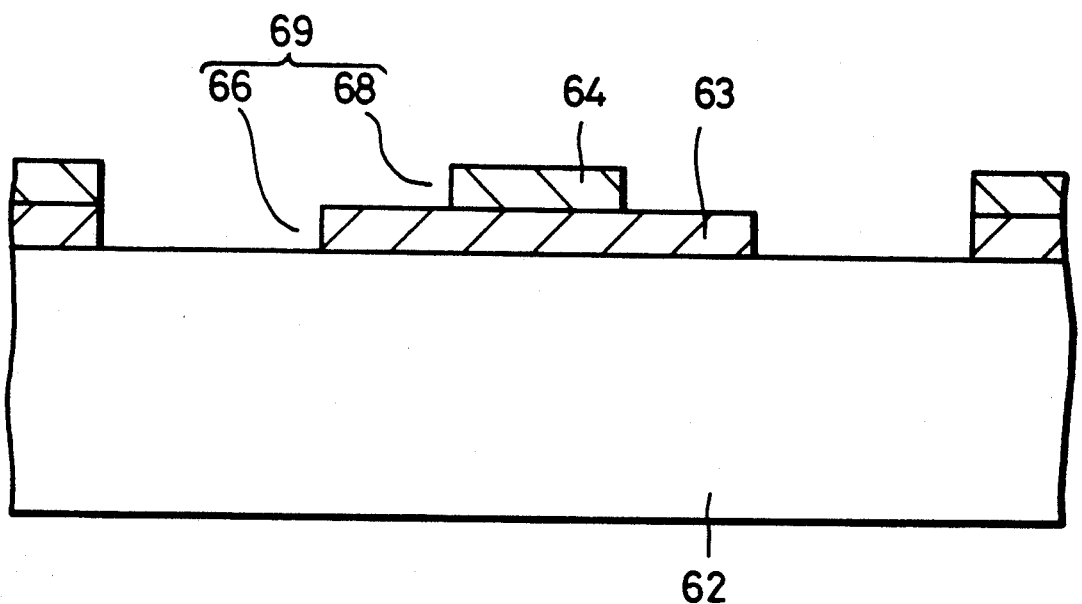
F I G. 5D
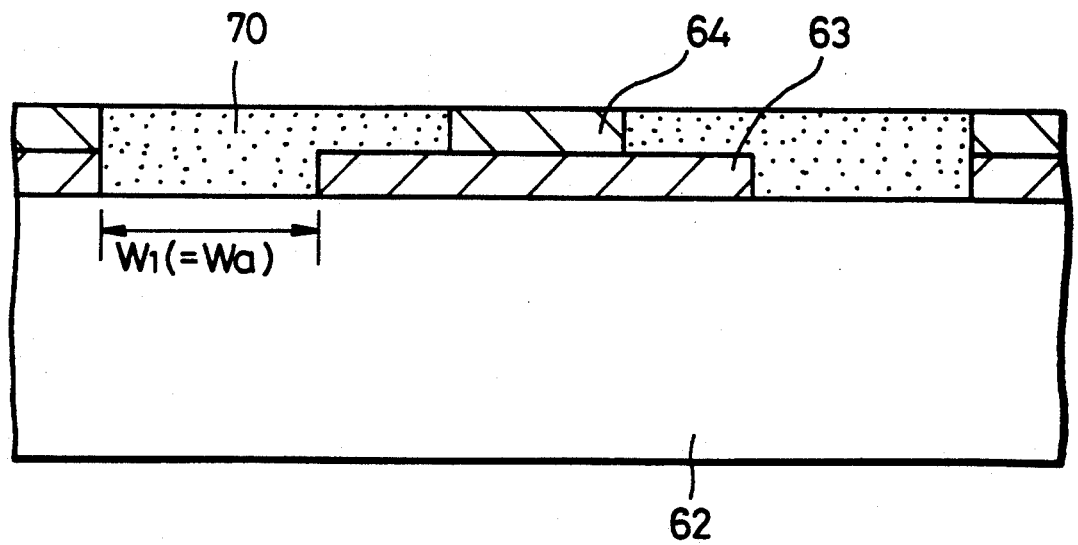

and illustrating an example of the manufacturing-process such that the base lead-out electrode is made of a polycide film.

METHOD OF MANUFACTURING SEMICONDUCTOR DEVICE INCLUDING A BIPOLAR TRANSISTOR

BACKGROUND OF THE INVENTION

1. Field of the Invention

The present invention relates to a method of manufacturing semiconductor devices, such as a bipolar transistor and so on.

2. Description of the Prior Art

As a conventional bipolar transistor, a ultra-high speed bipolar transistor is proposed, in which a base lead-out electrode and an emitter lead-out electrode are made of a polycrystalline silicon film and base and emitter regions are formed in a self-alignment fashion.

FIG. 1 is a schematic diagram showing an example of such conventional ultra-high speed bipolar transistor. As shown in FIG. 1, a base lead-out electrode 7 made of a first p+ type polycrystalline silicon film is formed on an n-type epitaxial film 6 which will be served as a collector region 3 on a first conductivity type, e.g., p-type semiconductor substrate 2. A p+ type external base region 8 is formed by the impurity diffusion process into the epitaxial film 6. After a link base region 11 is formed by the ion implantation-process via an opening 10 selectively formed through the p+ type polycrystalline silicon film and an SiO₂ film 9 formed on the p+ type polycrystalline silicon film in order to connect the external base region 8 and an intrinsic base region, an insulating side wall, i.e., an SiO₂ side wall 12 is formed at the opening 10 and a second polycrystalline silicon film 13 is formed on the opening 10, whereby p-type impurities and n-type impurities are introduced into the second polycrystalline silicon film 13 to form a p-type intrinsic base region 4 and an n-type emitter region 5 in a self-alignment fashion, thus the second polycrystalline silicon film 13 being formed as an emitter lead-out electrode. In FIG. 1, reference numeral 14 denotes an n-type collector buried layer, 15 a p-type channel stopper region, 16 an n-type collector lead-out region, 20 a field insulating film, and 17, 18 and 19 a base electrode, a collector electrode and an emitter electrode made of metal (e.g., aluminum, Al), respectively.

In order for this ultra-high speed bipolar transistor to operate at higher speed in the future, it is important to reduce the base resistance $R_{BB}$ more by reducing the resistance of the base-deriving electrode 7, which then requires the base lead-out electrode 7 to be made of silicide FIGS. 2A through 2F are respectively manufacturing-process diagrams of a bipolar transistor, and illustrating an example of the manufacturing-process such that the base lead-out electrode is made of a polycide film.

Referring to FIG. 2A, a second conductivity type, i.e., n-type collector buried layer 14 and a p-type channel stopper region 15 are formed on one major surface of a silicon substrate 2 of, for example, a first conductivity type, i.e., p type and then an n-type epitaxial layer 6a is grown on the n-type collector buried layer 14. An n-type collector lead-out region 16 of high concentration also is formed so as to reach the collector buried layer 14, and a field insulating film 20 is formed by the selective oxidation-process over the entire surface except the collector lead-out region 16 and the region 6a in which base and emitter regions will be formed. Then, a thin SiO₂ film 21 is formed on the whole surface and etched out at its portion corresponding to the region 6a, thereby a so-called polycide film 24 being composed of a first p+ type polycrystalline silicon film 22 serving as a base lead-out electrode and a metal silicide, for example, a tungsten silicide (WSi) film 23. Thereafter, the polycide film 24 is subjected to the patterning-process via a first resist mask 25.

In the next process, as shown in FIG. 2B, an SiO₂ film 9 is deposited over the whole surface including the polycide film 24 treated by the patterning-process by a chemical vapor deposition (CVD)-process and then a second resist mask 26 is formed. Then, as shown in FIG. 2C, the SiO₂ film 9 and the polycide film 24 are selectively etched away at their portions corresponding to an active region in which base and emitter regions will be formed by means of the second resist mask 26, thereby an opening 10 and a base lead-out electrode 7 made of the polycide film 24 being formed.

As shown in FIG. 2D, a thin thermally-oxidized film, i.e., SiO₂ film 27 is formed on the surfaces of the polycrystalline silicon film 22 and the substrate silicon within the opening 10 by the thermal oxidation-process. Thereafter, the ion implantation of p-type impurities, e.g., boron is carried out through the SiO₂ film 27 so as to form, for example, a link base region, or an intrinsic base region, a link base region 11 in this example, on the surface of the region 6a.

In the next process, as shown in FIG. 2E, an SiO₂ film is deposited by the CVD-process and then the resultant CVD SiO₂ film is densified by the heat treatment-process of about 900° C. In this heat treatment-process, an external base region 8 is partly formed by the diffusion of boron from the p+ type polycrystalline silicon film 22. Thereafter, the so-called etch back-process is carried out to form an SiO₂ side wall 12 on the side surface of the opening 10.

Then, a second polycrystalline silicon film 13 is formed in an opening 28 restricted by the side wall 12 by the CVD-process as shown in FIG. 2F. The polycrystalline silicon film 13 is treated by the ion implantation-process of p-type impurities (e.g., B or BF₂) and then annealed, thereby a p-type intrinsic base region 4 being formed on the active region. Subsequently, the polycrystalline silicon film 13 is treated by the ion implantation-process of n-type impurities (e.g., arsenic) and annealed, thereby forming an n-type emitter region 5. Alternatively, the p-type and n-type impurities may be implanted on the polycrystalline silicon film 13 by means of the ion implantation technique and simultaneously annealed by the annealing-process, thereby the p-type intrinsic base region 4 and the n-type emitter region 5 being formed. In the annealing-process when the base and emitter regions 4 and 5 are formed, the external base region 8 is finally formed by the diffusion-process of boron from the p+ polycrystalline silicon film 22 at the same time. Thereafter, contact holes are formed through the SiO₂ film 9, whereby a base electrode 17, a collector electrode 18 and an emitter electrode 18 made of metal (e.g., aluminum, Al) are formed. A ultra-high speed bipolar transistor 29 is manufactured in this fashion.

As a method of manufacturing a bipolar transistor by utilizing a polycrystalline silicon burying technique (see PP. 420 to 423 of IEDM 86), a method shown in FIGS. 3A through 3E is proposed.

As shown in FIG. 3A, an n-type collector buried layer 32 and a p-type channel stopper region 33 are formed on a p-type silicon substrate 31 and then an n-type epitaxial film 34 serving as a collector region is formed. A collector lead-out region 35 reaching the collector buried layer 32 is formed and a field insulating film 36 is formed by the selecting oxidation-process. After an $Si_3N_4$ film 37 and a CVD $SiO_2$ film 38 are formed, they are treated by the patterning-process to form openings 39 at their portions corresponding to base lead-out electrodes which will be formed later.

In the next process, as shown in FIG. 3B, a p+ polycrystalline silicon film 40a is formed over the entire surface and a resist film 41 is formed. Then, the etch back-process is performed to leave resist films 41 on level difference portions of the p+ polycrystalline silicon film 40.

Referring to FIG. 3C, the p+ type polycrystalline silicon film 40a is treated by the selective etching-process by utilizing the resist films 41 as the mask to thereby form a base lead-out electrode 40 of the p+ type polycrystalline silicon film 40a.

In the next process, as shown in FIG. 3D, the CVD $SiO_2$ film 38 is selectively removed at its portions corresponding to the active region and the collector lead-out region 35 and the surface of the p+ type polycrystalline silicon film 40a of the base lead-out electrode 40 is treated by the selective oxidation-process, thereby an $SiO_2$ film 41 being formed. At that time, p-type impurities are diffused from the p+ type polycrystalline silicon film to partly form an external base region 42.

The $Si_3N_4$ film 37 is selectively removed by hot phosphoric acid and a p-type base region 43 is formed by implanting p-type impurities on the active region by the ion implantation-technique.

Then, a second n+ type polycrystalline silicon film 45a is formed and treated by the patterning-process to thereby form an emitter lead-out electrode 46 and a collector lead-out electrode 47. Thereafter, the second n+ type polycrystalline silicon film 45a is annealed and an n-type emitter region 44 is formed by the diffusion-process of n-type impurities from the n type emitter region 44.

In the next process, contact holes are formed and a base electrode 48, an emitter electrode 49 and a collector electrode 50, each made of metal such as aluminum, Al are formed, thereby a bipolar transistor 51 shown in FIG. 3E being manufactured.

The bipolar transistor 29 made by using the polycide film 24 as shown in FIGS. 2A through 2F has the following problems such that the reliability characteristic, is degraded, etc.

More specifically, after the openings 10 are formed through the $SiO_2$ film 9 and the polycide film 24, in the manufacturing process shown in FIG. 2OD, the surfaces of the polycrystalline silicon film 22 and the substrate silicon are treated by the thermal oxidation-process and then the ion implantation-process is performed so as to form the link base region (or the intrinsic base region) by means of the thin $SiO_2$ film. In that thermal oxidation-process, because the metal silicide film 23 is exposed to the side wall of the opening 10, metal escapes into the $SiO_2$ film 27 due to the so-called metal diffusion (i.e., out-diffusion) from the metal silicide film 23 and diffused into the active region, which leads to the occurrence of so-called metal contamination. The metal contamination brings about various troubles, such as the reduction of life time of carriers in the active region, the increase of a recombination current and so on. Further, in the thermal oxidation-process, a stress occurs in the polycide film 24, thus rendering the metal silicide film 23 and the $SiO_2$ film 9 formed thereon being released from each other.

The bipolar transistor 51 made by utilizing the polycrystalline silicon burying technique as shown in FIGS. 3A to 3E has the following problems.

(i) The polycrystalline silicon 40a from which the base electrode is derived and the polycrystalline silicon 45a from which the emitter and collector electrodes are derived are formed independently, which unavoidably increases the manufacturing process.

(ii) The surface of the base lead-out electrode 40 is treated by the thermal oxidation-process by using the film 41 in order to insulate and separate the base lead-out electrode 40 and the emitter lead-out electrode 46 as described above. In this thermal oxidation process (selective oxidation-process utilizing the so-called $Si_3N_4$ film as the mask), a crystal defect occurs due to a stress produced near the bird's beak of the thermally-oxidized film 41 so that, when the emitter region 44 is formed by the impurities diffusion from the n+ polycrystalline silicon 45a serving as the emitter lead-out electrode, the impurities are diffused at an increased speed. There is then the risk that a part of the emitter will go through the base region 43, which brings about an emitter-collector path leakage, resulting in the transistor characteristic of the bipolar transistor being degraded.

(iii) Since a so-called base contact width W between the base lead-out electrode 40 and the external base region 42 depends on an alignment among the field insulating film 36, the $SiO_2$ film 38 and the opening 39 formed through the $Si_3N_4$ film 37, the bipolar transistor cannot be densified sufficiently, which unavoidably limits the reduction of the base-collector path junction capacitance, thus hindering the bipolar transistor from being operated at high speed.

OBJECTS AND SUMMARY OF THE INVENTION

Accordingly, it is an object of the present invention to provide an improved method of manufacturing a semiconductor device in which the aforementioned shortcomings and disadvantages encountered with the prior art can be eliminated.

More specifically, it is an object of the present invention to provide a method of manufacturing a semiconductor device of high performance and high reliability which can remove the defects encountered with the semiconductor device utilizing a polycide film.

Another object of the present invention is to provide a method of manufacturing a semiconductor device of high performance and high reliability in which a contact width of a lead-out electrode can be reduced so that the semiconductor device can be densified more.

As a first aspect of the present invention, a method of manufacturing a semiconductor device is comprised of the steps of forming an opening portion through a polycide film and an insulating film sequentially formed on a semiconductor substrate of a first conductivity type so as to expose the semiconductor substrate, forming an insulating film on the side surface of the opening portion and the surface of the semiconductor substrate implanting an ion of a second conductivity type into the semiconductor substrate through the insulating film, and forming an insulating side wall in the opening portion. Thus, a metal pollution or the like in the active region due to a metal included in the polycide film can be prevented and a semiconductor device of high performance and high reliability can be manufactured.

In accordance with a second aspect of the present invention, a method of manufacturing a semiconductor device is comprised of the steps of laminating two kinds of insulating films on a semiconductor substrate, forming a stepped opening portion for contact composed of a first opening portion through which the semiconductor substrate is exposed and a second opening portion, communicating to the first opening portion, formed by selectively removing only the upper insulating film, and burying a conductor in the stepped opening portion. Therefore, the contact widths can be reduced more and as a consequence, a semiconductor device of high performance and high reliability can be manufactured.

The above and other objects, features, and advantages of the present invention will become apparent from the following detailed description of illustrative embodiments thereof to be read in conjunction with the accompanying drawings, in which like reference numerals are used to identify the same or similar parts in the several views.

BRIEF DESCRIPTION OF THE DRAWINGS

FIGS. 5A through 5D are respectively fundamental process diagrams showing a process of a method of manufacturing a semiconductor device according to a second embodiment of the present invention;

DETAILED DESCRIPTION OF THE PREFERRED EMBODIMENTS

The present invention will now be described with reference to the drawings.

FIGS. 4A through 4F show a first embodiment of the method of manufacturing a ultra-high speed bipolar transistor according to the present invention. Throughout FIGS. 4A to 4F, like parts corresponding to those of FIGS. 2A through 2F are marked with the same references and therefore need not be described in detail.

Figure 1:
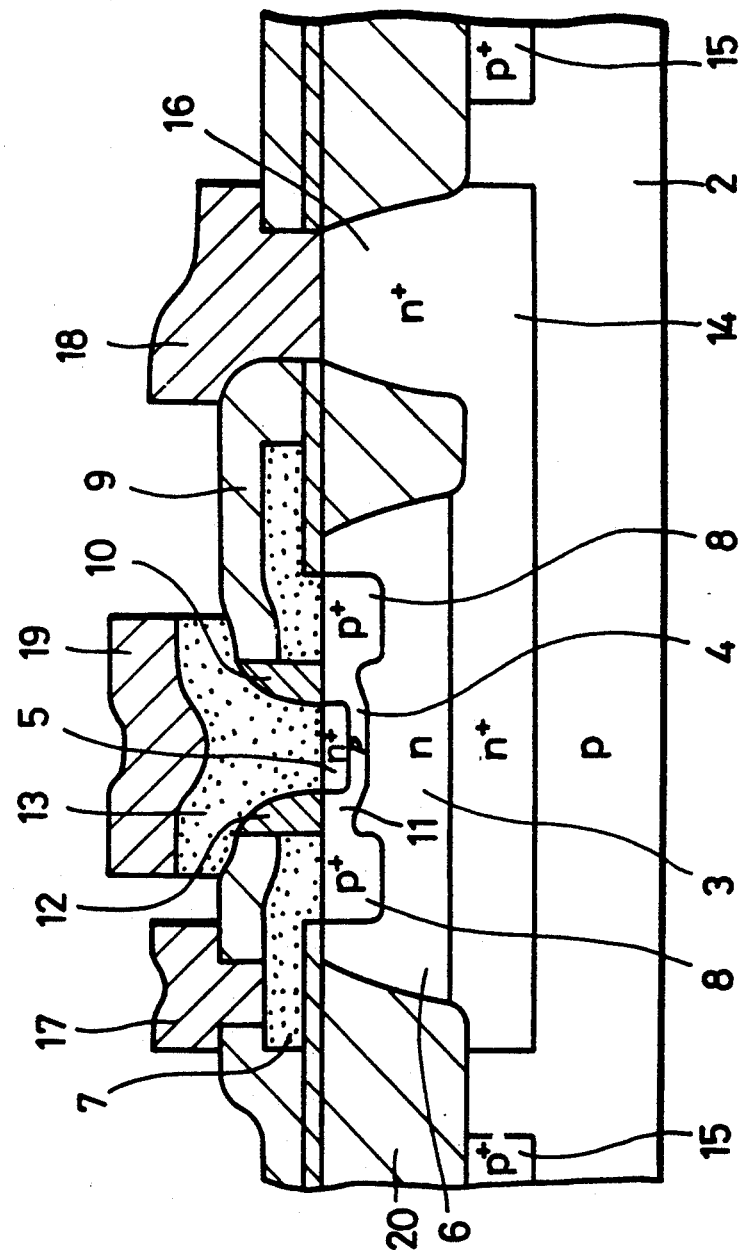
FIG. 1 is a schematic diagram showing a structure of a bipolar transistor according to the prior art.
Figure 2A:
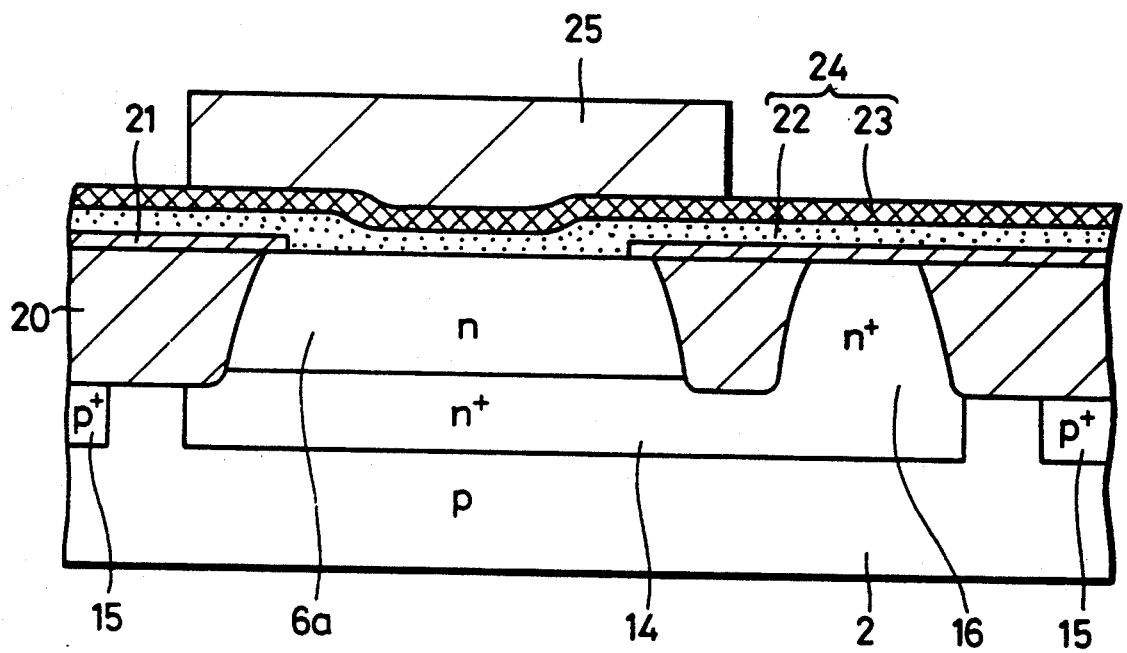
FIGS. 2A through 2F are respectively manufacturing-process diagrams of a bipolar transistor, and illustrating an example of the manufacturing-process such that the base lead-out electrode is made of a polycide film.
Figure 2B:
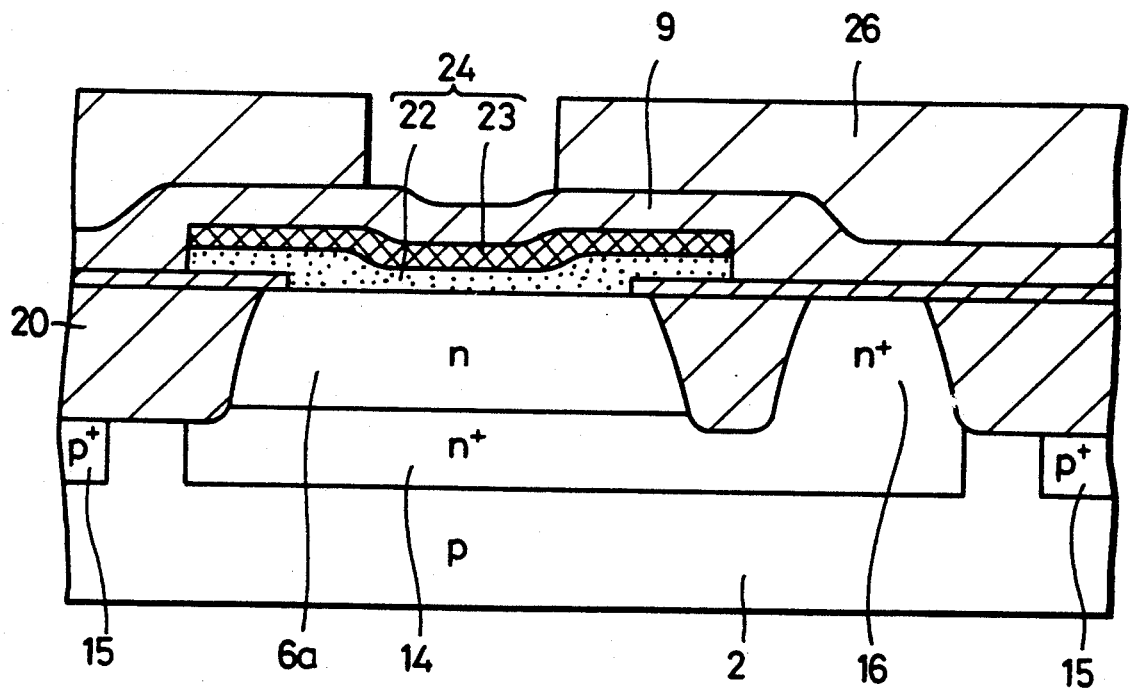
Figure 2C:
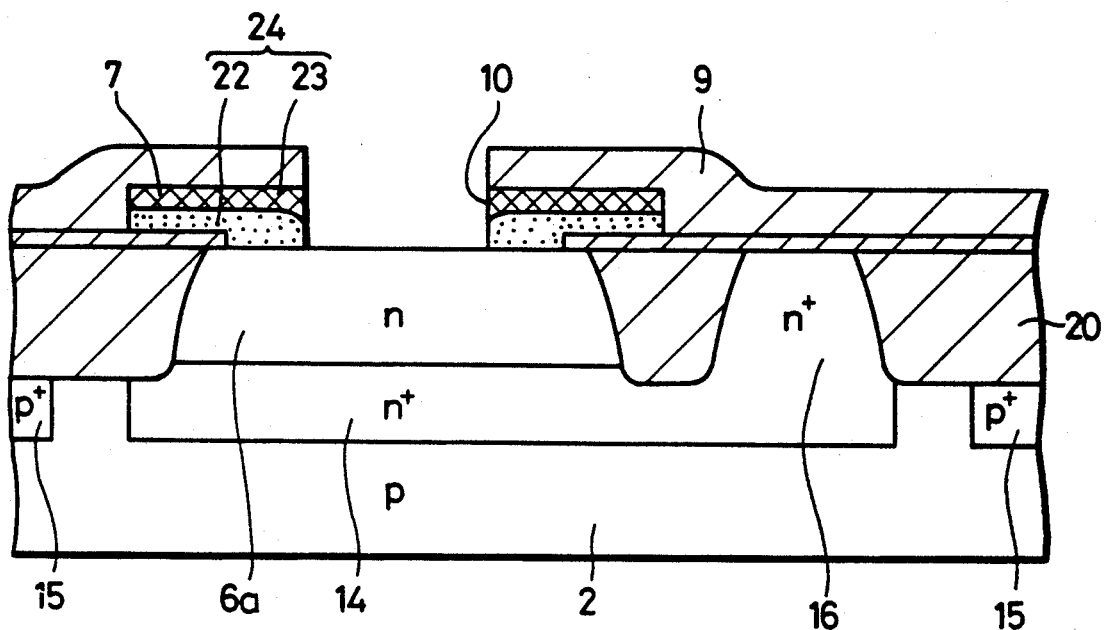
Figure 2D:
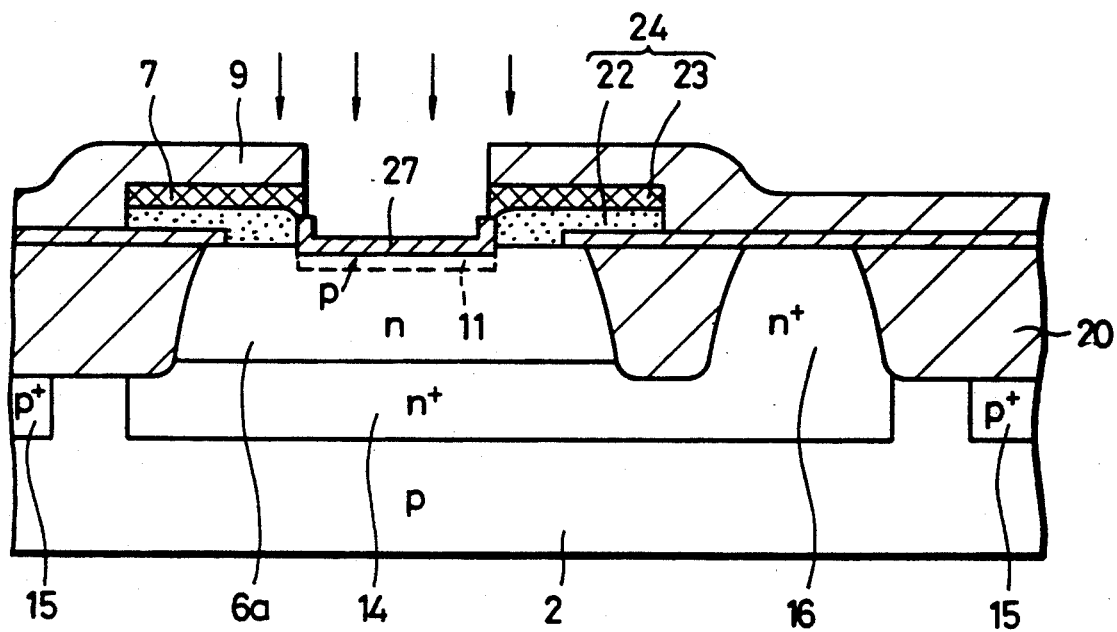
Figure 2E:
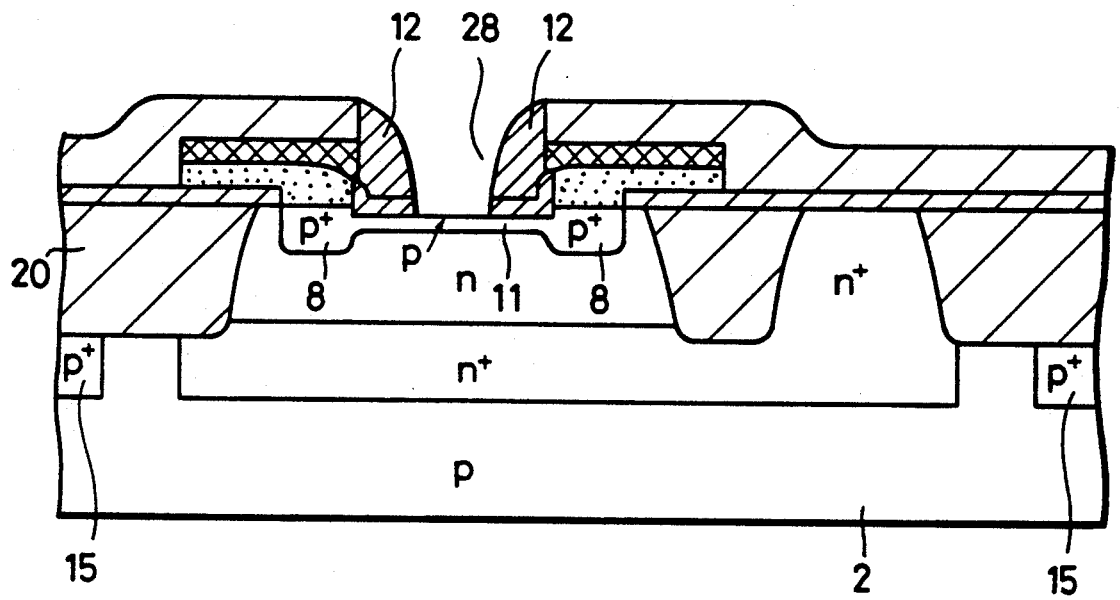
Figure 2F:
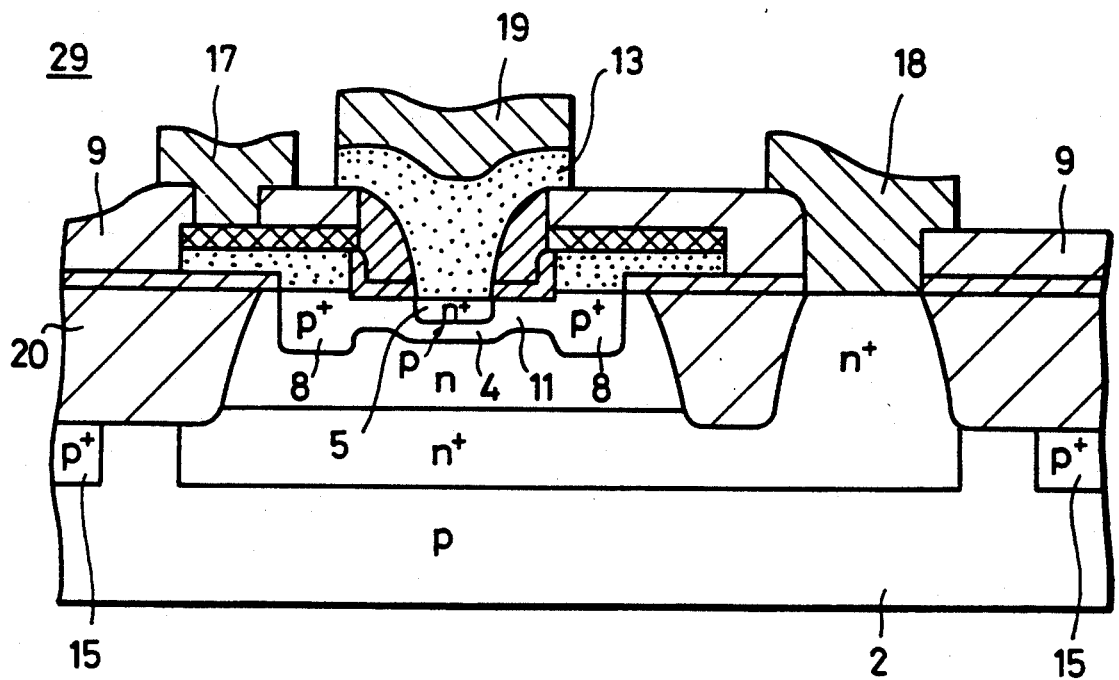
Figure 3A:
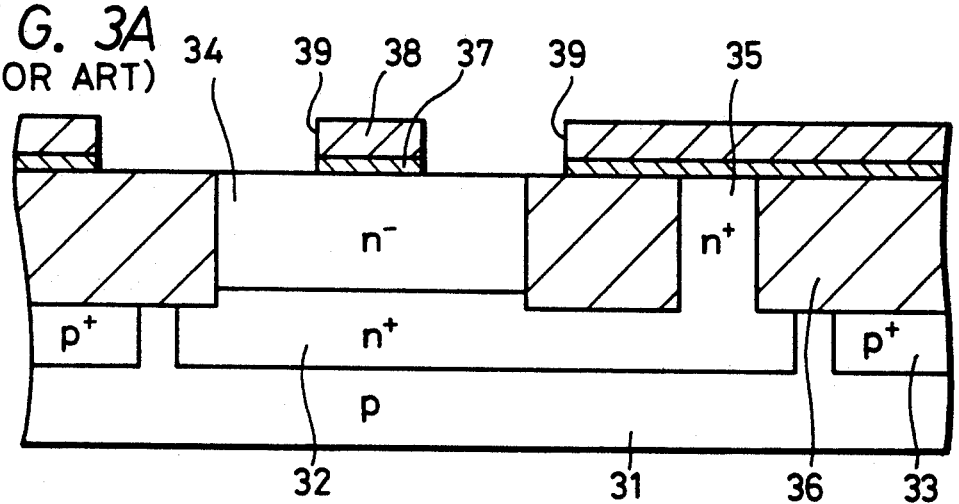
FIGS. 3A through 3E are manufacturing-process diagrams, respectively, to which references will be made in explaining a manufacturing-process of a bipolar transistor according to the prior art.
Figure 3B:
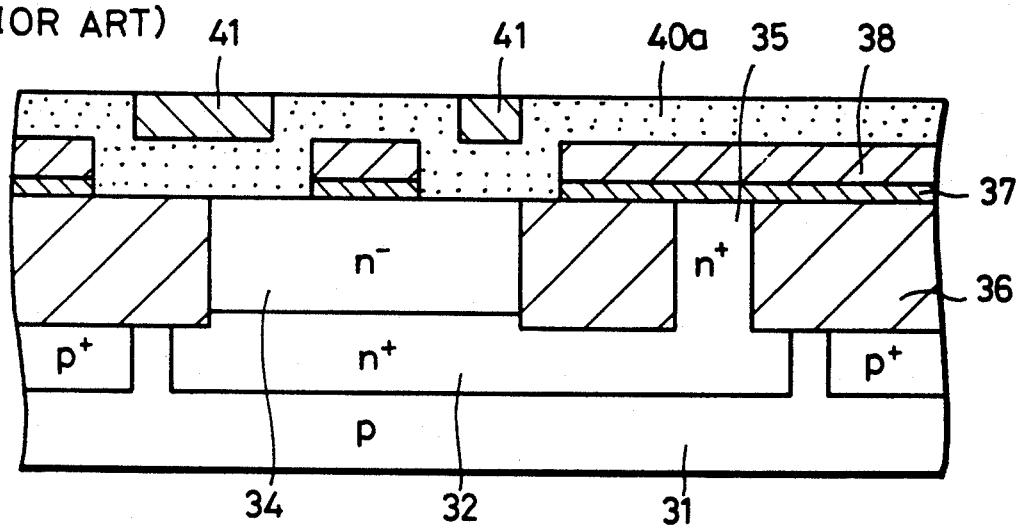
Figure 3C:
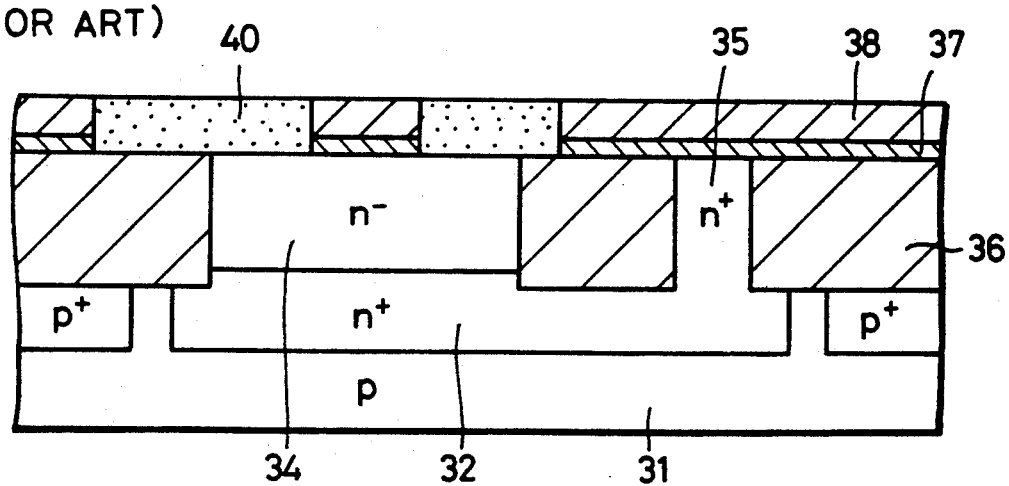
Figure 3D:
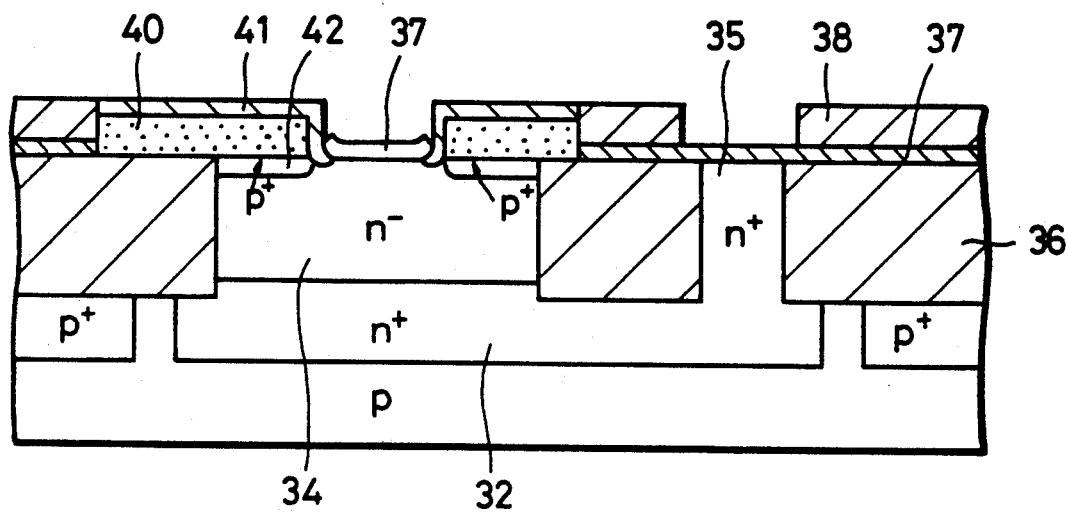
Figure 3E:
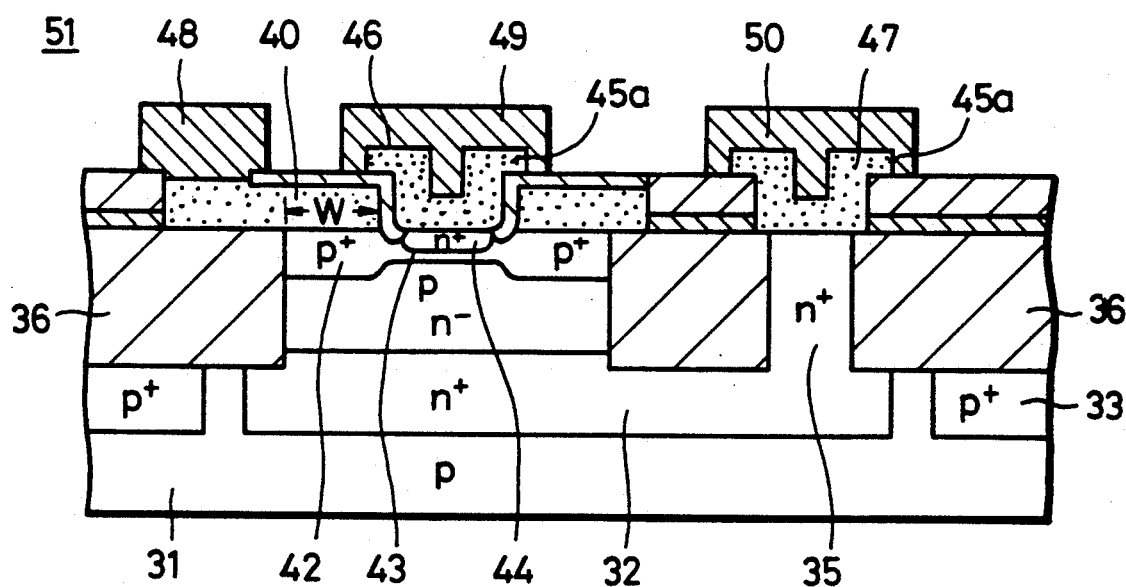
Figure 4A:
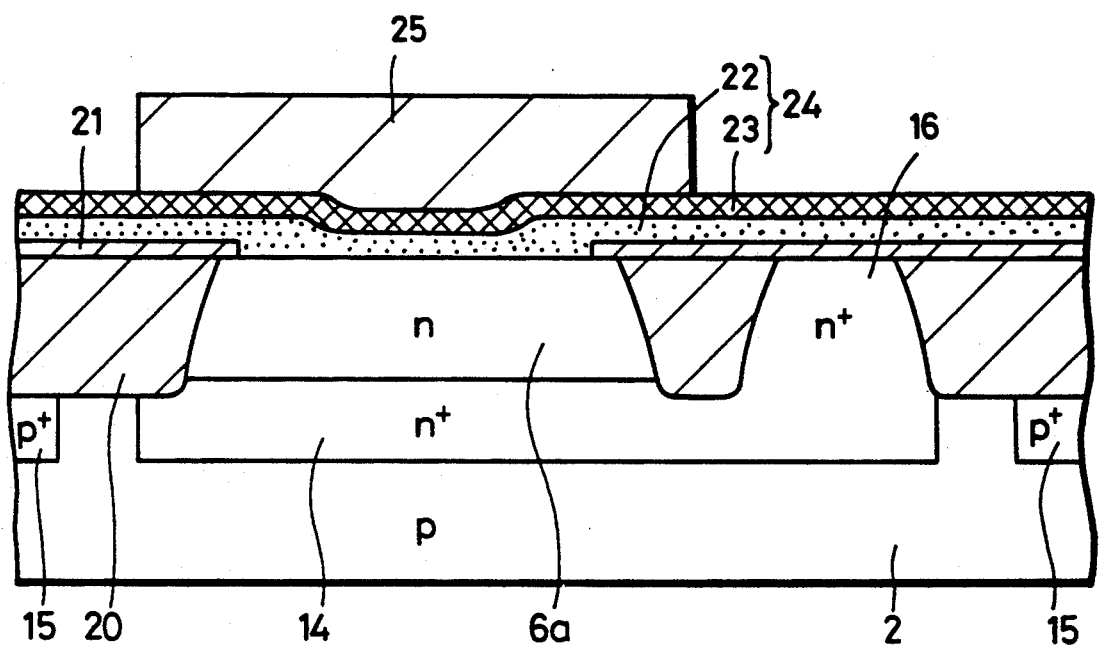
FIGS. 4A through 4F are respectively manufacturing-process diagrams of a method of a manufacturing a semiconductor device (e.g., bipolar transistor) according to a first embodiment of the present invention.

In this embodiment, as shown in FIG. 4A, an n-type collector buried layer 14, a p-type channel stopper region 15, an n-type collector lead-out region 16, and a region 6a composed of an n-type epitaxial film separated by a field insulating film 20 are first formed on a p-type silicon substrate 2. After opening a part corresponding to the region 6a of a thin film $SiO_2$ film 21 formed over the surface, a polycide film 24 composed of a p+ polycrystalline silicon film 22 constituting a base lead-out electrode and a metal silicide, for example, a tungsten silicide (WSi) film 23 is formed. Thereafter, the polycide film 24 is patterned through a first resist mask 25.

Figure 4B:
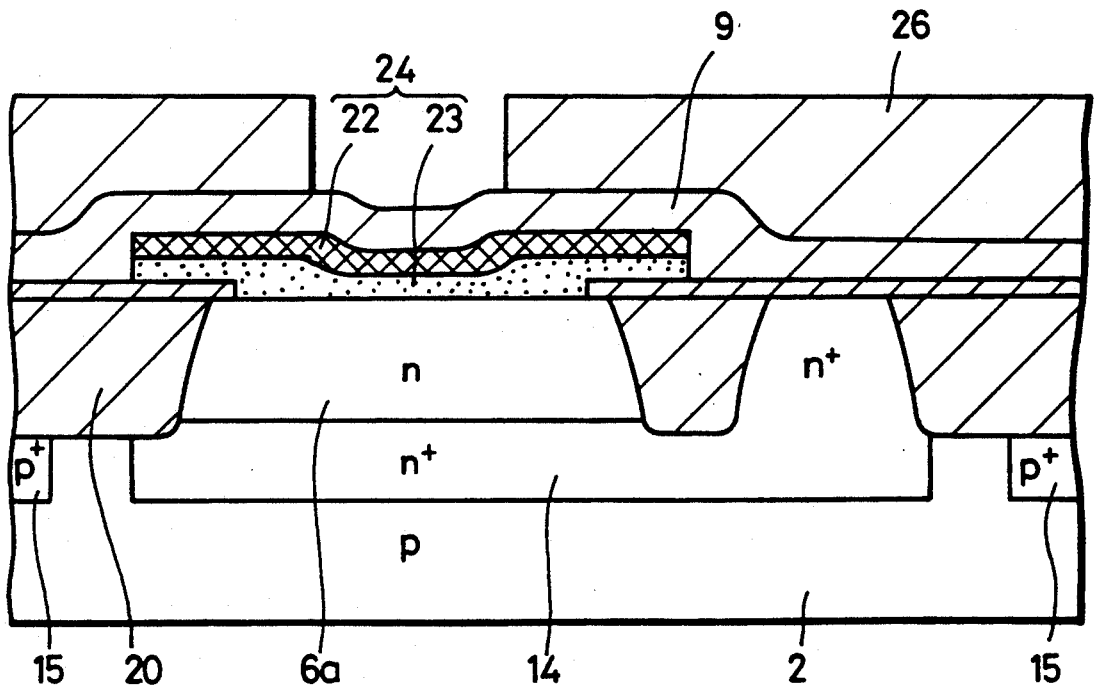

As shown in FIG. 4B, an insulating film, for example, an $SiO_2$ film 9 is deposited over the entire surface including the patterned polycide film 24 by the CVD method, and then a second resist mask 26 is formed.

Figure 4C:
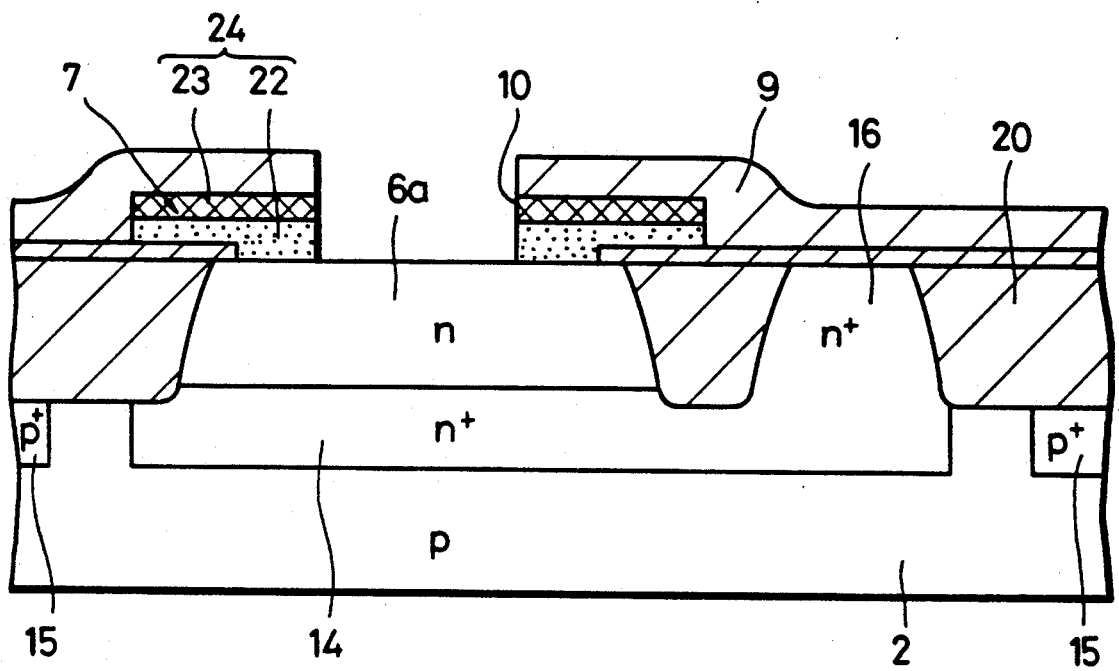

As shown in FIG. 4C, portions of the $SiO_2$ film 9 and the polycide film 24 corresponding to an active region in which a base region and an emitter region are to be formed are selectively etched through the second resist mask by using, for example, the RIE (reactive ion etching) process to form an opening 10 through which the region 6a is exposed. A base lead-out electrode 7 composed of the polycide film 24 is formed by this selective etching process.

Figure 4D:
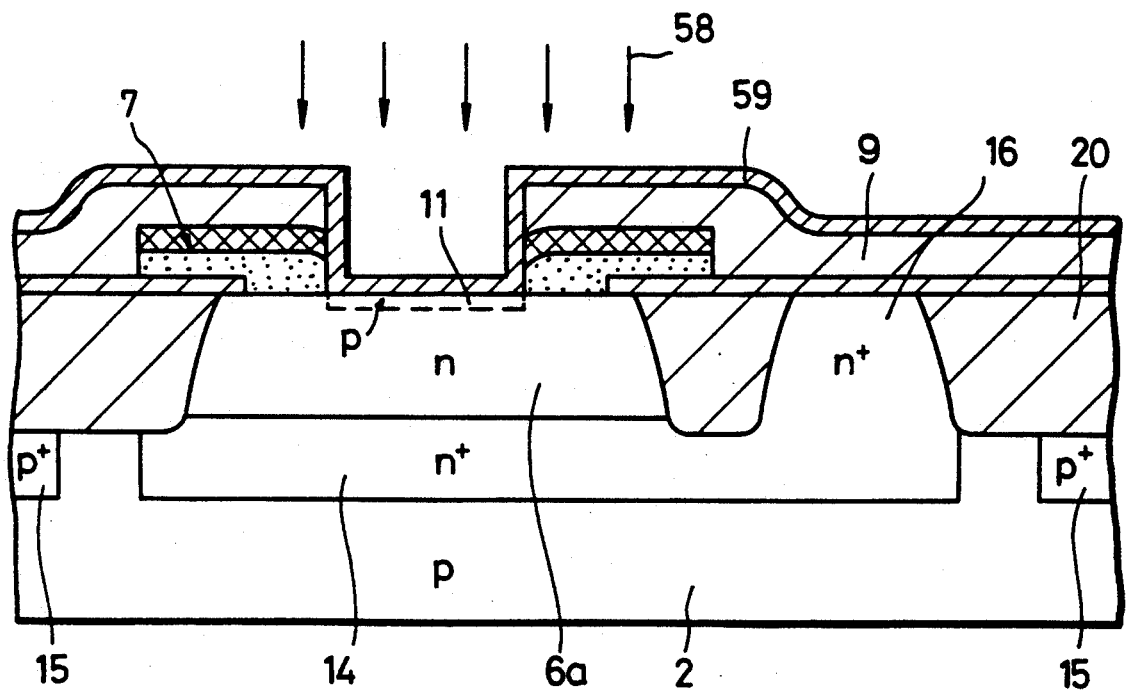

Next, as shown in FIG. 4D, a thin $SiO_2$ film 59 is deposited on the inner surface of the opening 10 and over the entire surface of the $SiO_2$ film by a low temperature CVD method (at approximately 400° C.). Since this thin $SiO_2$ film 59 is formed at a low temperature (400° C.), a metal will not be precipitated from the tungsten silicide film 23.

In the next process, a p-type impurity, for example, boron 58 is ion-implanted through the opening 10 with this thin $SiO_2$ film 59 used as a buffer to form on the surface of the region 6a, for example, a link base region or an intrinsic base region. In this embodiment, a link base region 11 is formed.

Figure 4E:
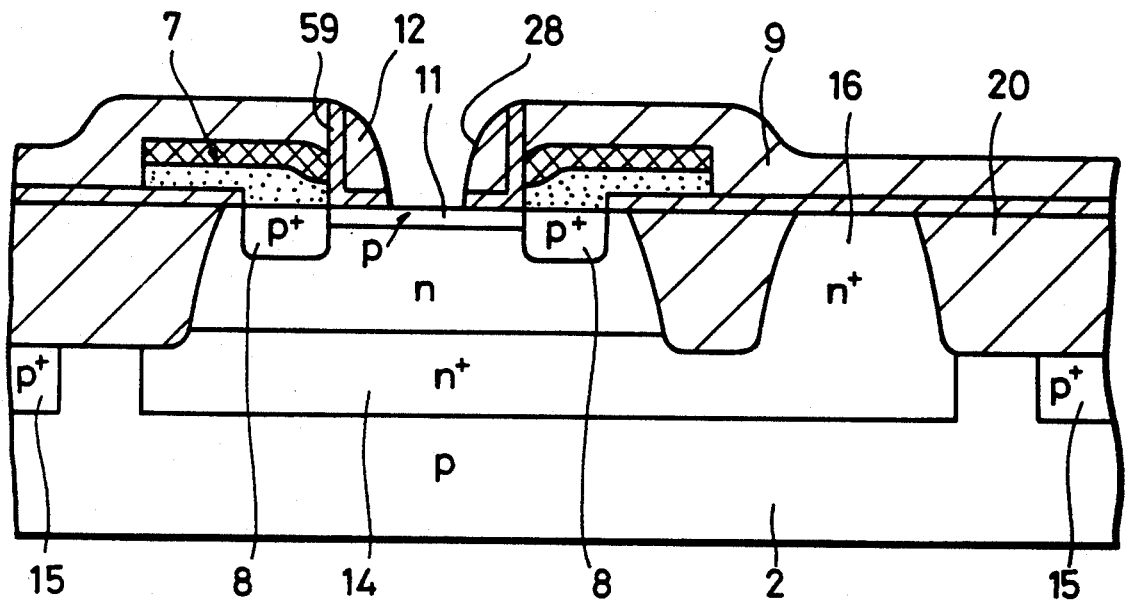

As shown in FIG. 4E, an $SiO_2$ film is deposited for forming a side wall (insulating side wall) over the entire surface by the CVD method at temperature of 700° C. or more and subjected to the RIE process to form an $SiO_2$ side wall 12 on the inner surface of the opening 10.

During the heat treatment of this process, an external base region 8 is partially formed by an impurity diffusion process, for example, boron diffusion from the p+ polycrystalline silicon film 22 constituting the base lead-out electrode 7.

Figure 4F:
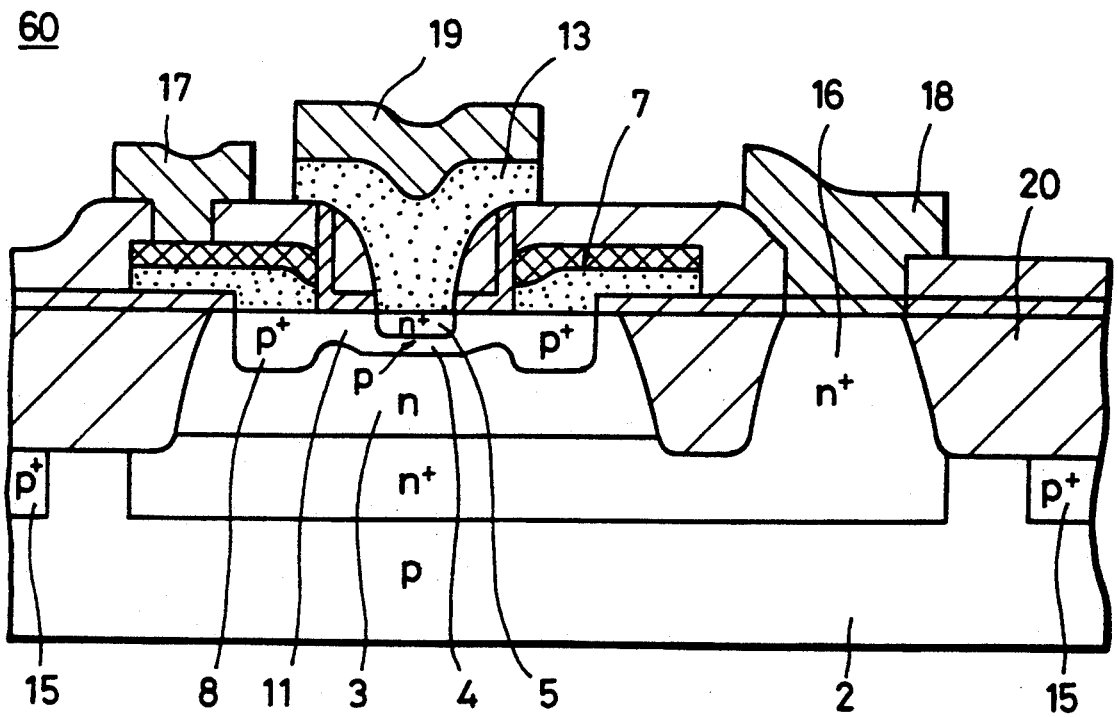

Next, as shown in FIG. 4F, a polycrystalline silicon film 13 which is to finally constitute an emitter lead-out electrode is formed in an opening 28 restricted by the $SiO_2$ side wall 12 by the CVD process. Then, a p-type impurity, for example, boron is ion-implanted into this polycrystalline silicon film 13, and annealed at temperature of 800° C. to 900° C. to diffuse boron to thereby form an intrinsic base region 4. Substantially, an n-type impurity, for example, arsenic is ion-implanted into the polycrystalline silicon film 13, and annealed at temperature of 800° C. to 1000° C. to diffuse the arsenic to thereby form an emitter region 5. During the annealing treatment for forming the base and emitter region, the boron is diffused from the p+ polycrystalline silicon film 22 constituting the base lead-out electrode 7 to thereby finally form the external base region 8. After the formation of the external base region, contact holes are formed in which a base electrode 17, a collector electrode 18 and an emitter electrode 19, all made of a metal (e.g., Al) are formed. A target ultra-high speed bipolar transistor 60 is thus obtained.

According to the above-described manufacturing method, after the opening 10 is formed by selectively etching the polycide film 24, when the thin SiO₂ film is formed as a buffer in the opening 10 as shown in FIG. 4D, the SiO₂ film 59 is formed by the low temperature CVD process at approximately 400° C. including the surface of the tungsten silicide film, thereby making it possible to suppress a metal diffusion or a tungsten diffusion (out-diffusion) from the tungsten silicide film 23 and accordingly to prevent metal from being polluted in the active region.

Then, while the SiO₂ side wall 12 is being formed, the surface of the tungsten silicide film is covered with the thin SiO₂ film 59, whereby a metal diffusion is suppressed by the SiO₂ film 59 even if the CVD process is performed for forming the side wall at a temperature of approximately 700° C. or more, and therefore the active region will not be polluted by metal through the side wall 12. As a consequence, it is possible to avoid a decrease in the carrier life time as well as an increase in a recombination current due to the metal pollution, thereby a further ultra-high speed operation being achieved.

Also, since the SiO₂ film 59 is formed by the CVD process not by a thermal oxidation process, a separation between the SiO₂ film 59 and the tungsten silicide film 23 as mentioned above will not occur due to a stress which is produced. Thus, according to this embodiment, it is possible to readily manufacture an ultra-high speed bipolar transistor of high performance and high reliability.

Another embodiment of the method of manufacturing a semiconductor device according to the present invention will be described next.

Initially, a basic manufacturing process will be described with reference to FIG. 5A through 5D. As shown in FIG. 5A. two kinds of insulating films, an SiO₂ film 63 and an Si₃N₄ film 64 in this embodiment, are laminated on one major surface of a semiconductor substrate 62. Then, a first resist mask 65 is formed on the Si₃N₄ film 64.

As shown in FIG. 5B, the Si₃N₄ film 64 and the SiO₂ film 63 are selectively removed through the first resist mask 65 by the RIE process to form a first opening 66. Further, a second resist mask 67 is formed.

As shown in FIG. 5C, a part of the Si₃N₄ film 64 only is selectively removed through the second resist mask 67 to form a second opening 68. Both openings 66 and 68 constitute a stepped opening portion 69.

Next, as shown in FIG. 5D, over the entire surface including the stepped opening portion 69, there is formed a conductive film made of polycrystalline silicon, metal or the like, a polycrystalline silicon film 70 in this embodiment, by the CVD process. Then, the etch back is performed such that the polycrystalline silicon film 70 is buried in the stepped opening portion 69.

According to this method, the polycrystalline silicon 70 can be buried in the stepped opening portion 69 of a stepped configuration, whereby the buried polycrystalline silicon 70 can be used as a lead-out electrode. A contact width $W_1$ between the lead-out electrode and the semiconductor substrate is determined by a width $W_a$ of the opening 66 formed through the first resist mask 65. It is therefore possible to reduce the width $W_1$ up to the limit of the resolution of the lithography for forming the resist mask 65.

FIGS. 6A through 6G illustrate an example of a manufacturing method of a bipolar transistor to which the above-mentioned method is applied.

Figure 6A:
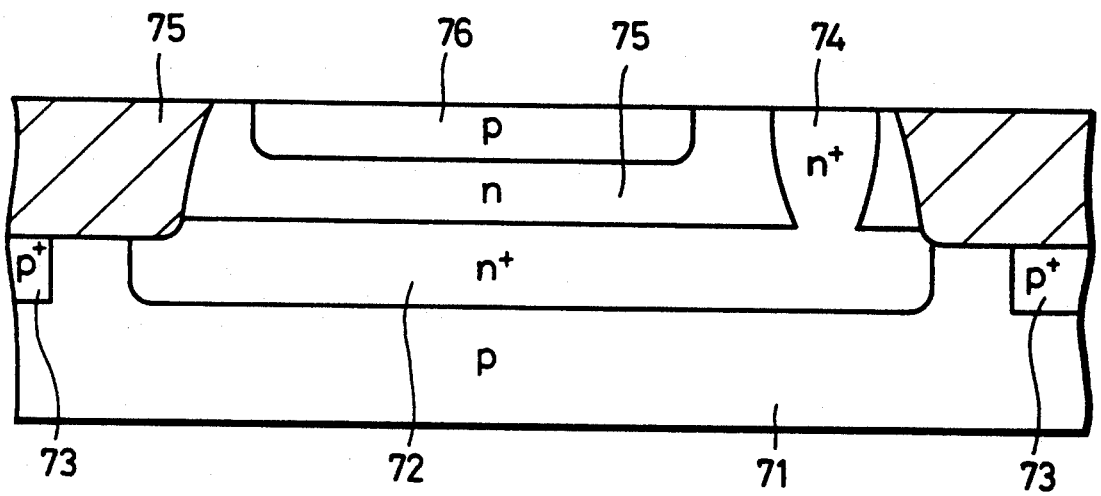
FIGS. 6A through 6G are respectively cross-sectional views illustrating an example where the second embodiment is applied to manufacture a bipolar transistor.

In this embodiment, as shown in FIG. 6A, on a p-type silicon substrate 71, there are formed an n-type collector buried layer 72, a p-type channel stopper region 73, a collector region 75 of an n-type epitaxial film separated by a field insulating film 75 and an n-type collector lead-out region 74. Then, a p-type base region 76 is formed on the collector region 75.

Figure 6B:
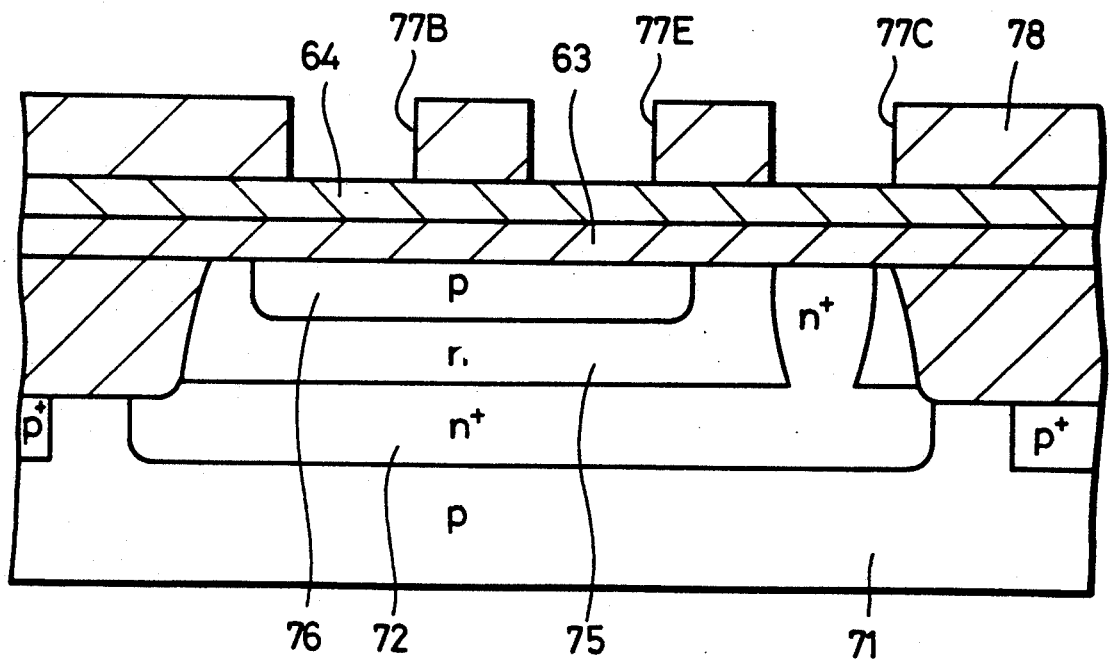

Then, as shown in FIG. 6B, after forming an SiO₂ film 63 and an Si₃N₄ film 64, a first resist mask 78 is formed which has openings 77B, 77E and 77C at positions corresponding to a base lead-out region, an emitter region and a collector lead-out region which are to be formed later.

Figure 6C:
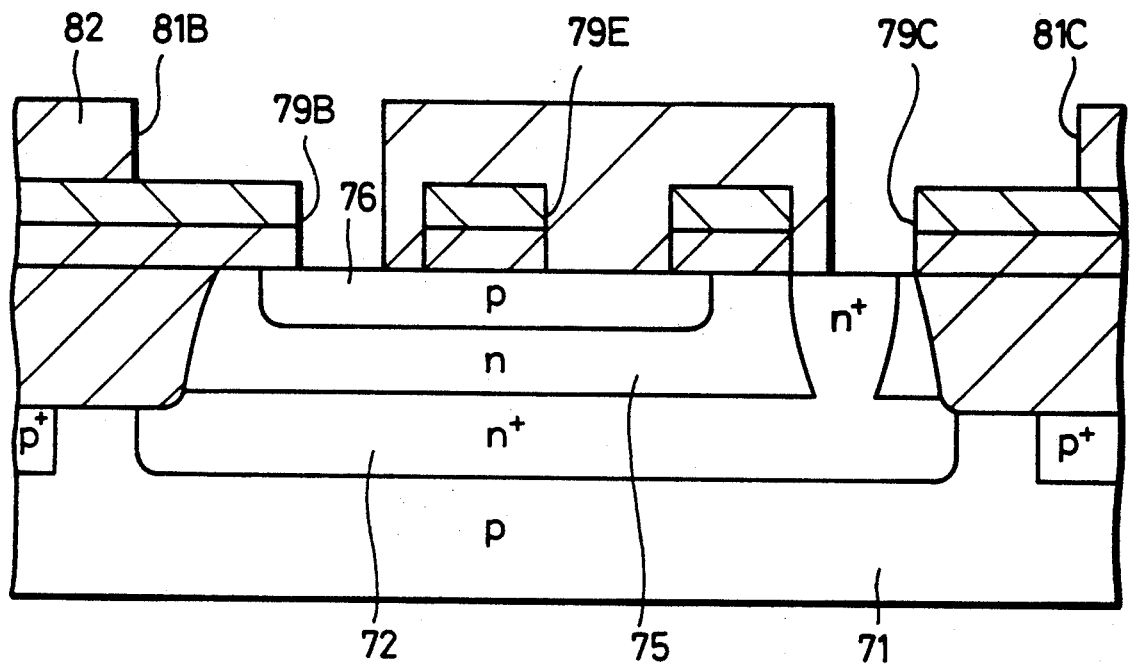

Next, as shown in FIG. 6C, the SiN film 64 and the SiO₂ film 63 are selectively etched through the first resist mask 80 to form first openings 79B, 79E and 79C through which the silicon surface is exposed. Then, a second resist mask 82 is formed which has openings 81B and 81C respectively located over a portion from the base lead-out region to the field insulating film and over a portion from the collector lead-out region to the field insulating film.

Figure 6D:
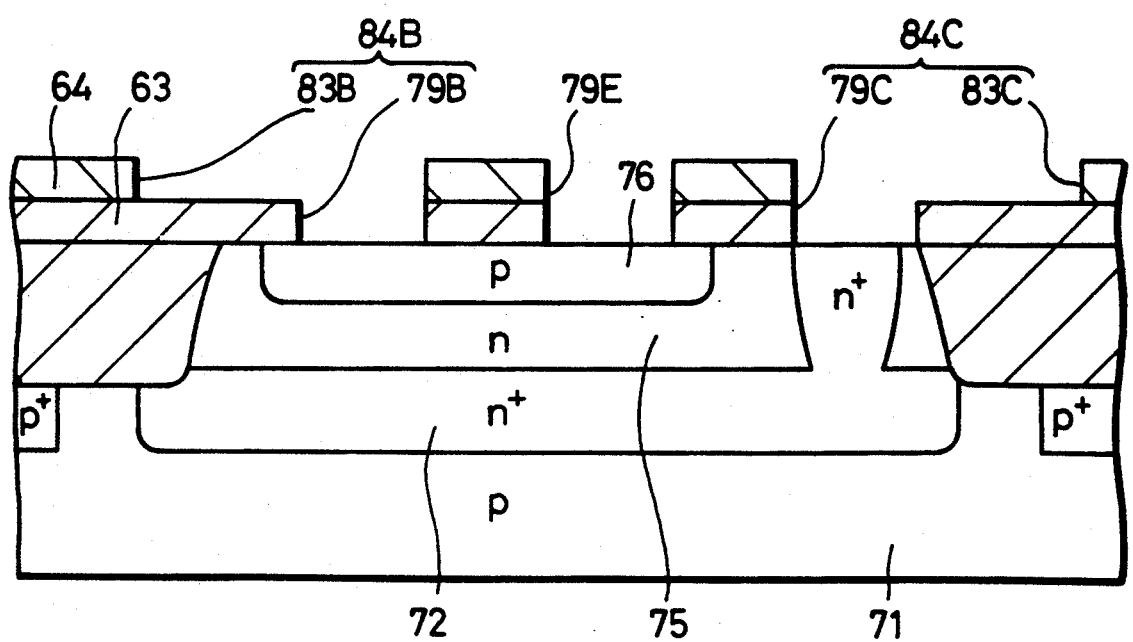

As shown in FIG. 6D, only the upper SiN film 64 is selectively etched through the second resist mask 82 to form second openings 83B and 83C, where a stepped opening 84B made up of the openings 79B, 83B and a stepped opening 84C made up of the openings 79C, 83C are formed.

Figure 6E:
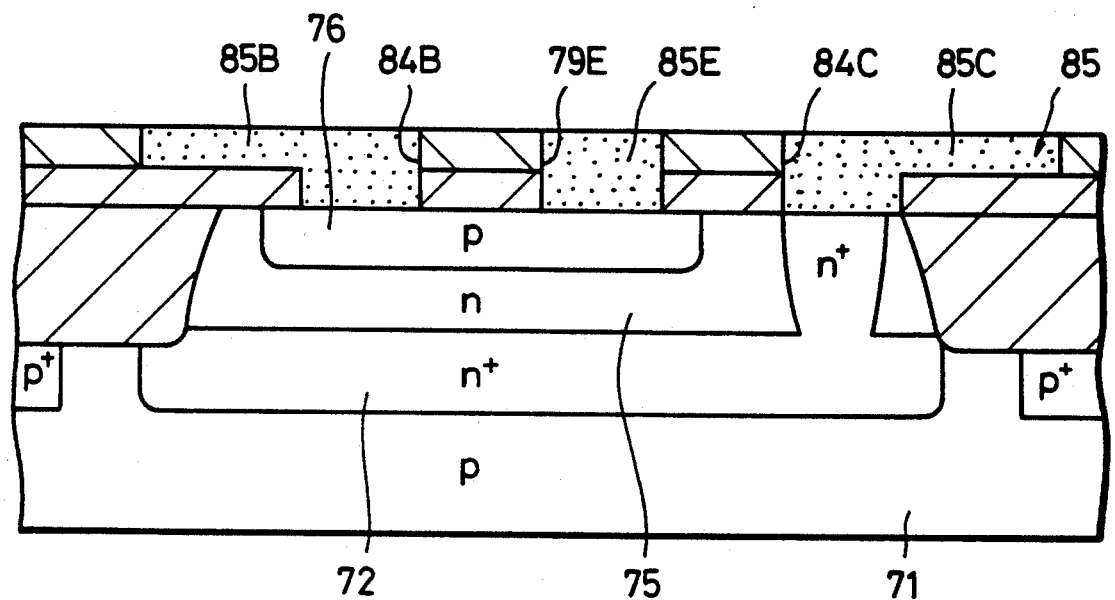

Next, after forming a polycrystalline silicon film 85 over the entire surface by the CVD process, the surface is made flat by the etch back process. Then, as shown in FIG. 6E, polycrystalline silicon films 85B, 85C and 85E are buried in the stepped openings 84B, 84C and the opening 79E.

Figure 6F:
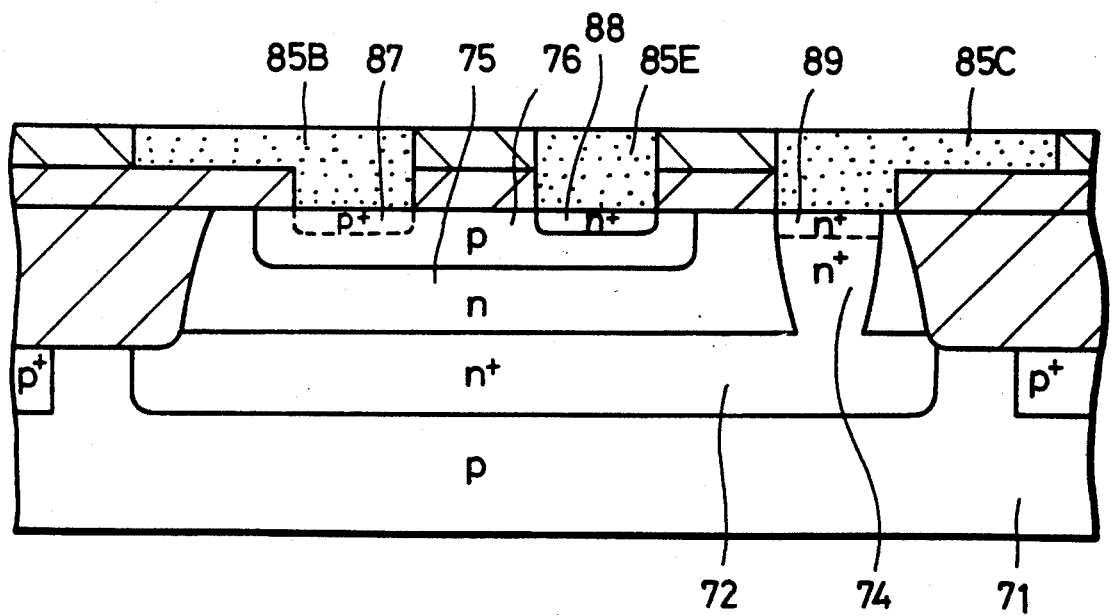

Though not shown, a p-type impurity, for example, boron is selectively ion-implanted into the polycrystalline silicon 85B in the stepped opening 84B through a resist mask, while an n-type impurity, for example, arsenic is ion-implanted into the polycrystalline silicon film 85E in the stepped opening 79E and the polycrystalline silicon film 85C in the stepped opening 84C. Then, the anneal treatment is performed, whereby a p+ base lead-out region 87 is formed by a boron diffusion process from the polycrystalline silicon film 85B, an n+ emitter region 88 is formed by an arsenic diffusion from the polycrystalline silicon film 85E, and a highly concentrated region 89 is formed in the collector lead-out region 74 by an arsenic diffusion from the polycrystalline silicon film 85C, as shown in FIG. 6F.

In this process, the p+ polycrystalline silicon film 85B becomes a base lead-out electrode, the n+ polycrystalline silicon film 85E becomes an emitter lead-out electrode, and the n+ polycrystalline silicon film 85C becomes a collector lead-out electrode.

Figure 6G:
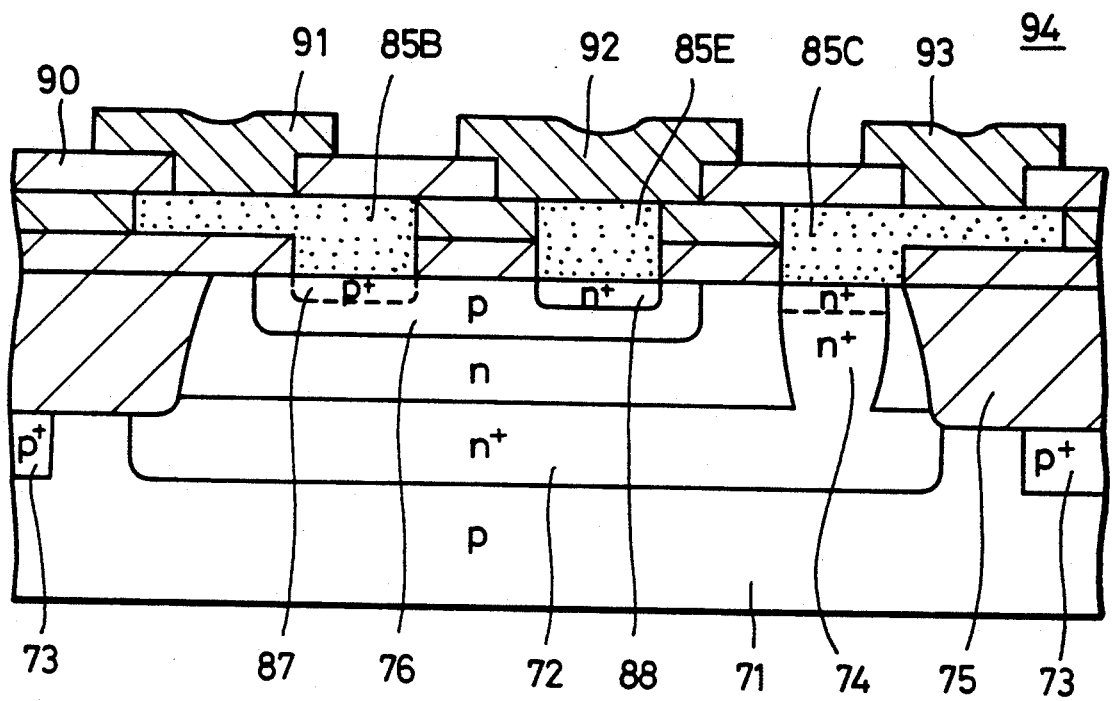

Then, after an SiO₂ film 90 is deposited over the entire surface, contact holes are formed therethrough, and a base electrode 91, an emitter electrode 92 and a collector electrode 93, all made of a metal (e.g., Al), are formed on the respective lead-out electrodes 85B, 85E, 85C, thereby completing a target npn bipolar transistor 94 as shown in FIG. 6G.

According to the above-mentioned method of manufacturing the bipolar transistor, since the emitter lead-out electrode 85E, the base lead-out electrode 85B and the collector lead-out electrode 85C are simultaneously formed by using the first polycrystalline silicon film 85, the number of the manufacturing processes can be reduced.

Also, since the base lead-out electrode 85B is separated from the emitter lead-out electrode 85E by the insulating films 63, 64 used for forming the stepped openings in a self-alignment fashion, the production of stress, inherent in the conventional thermal oxidization shown in FIG. 3, is avoided, whereby a satisfactory transistor characteristic can be provided.

It is further possible to reduce the contact width of each lead-out electrode including the base lead-out electrode 85B up to the limit of the lithography for forming the first opening 77. For this reason, a junction capacitance, for example, between the base and the collector can be reduced, which can promote a higher speed operation. As described above, according to this embodiment, a bipolar transistor of high performance and high reliability and which can be highly integrated can be manufactured with ease.

Figure 7A:
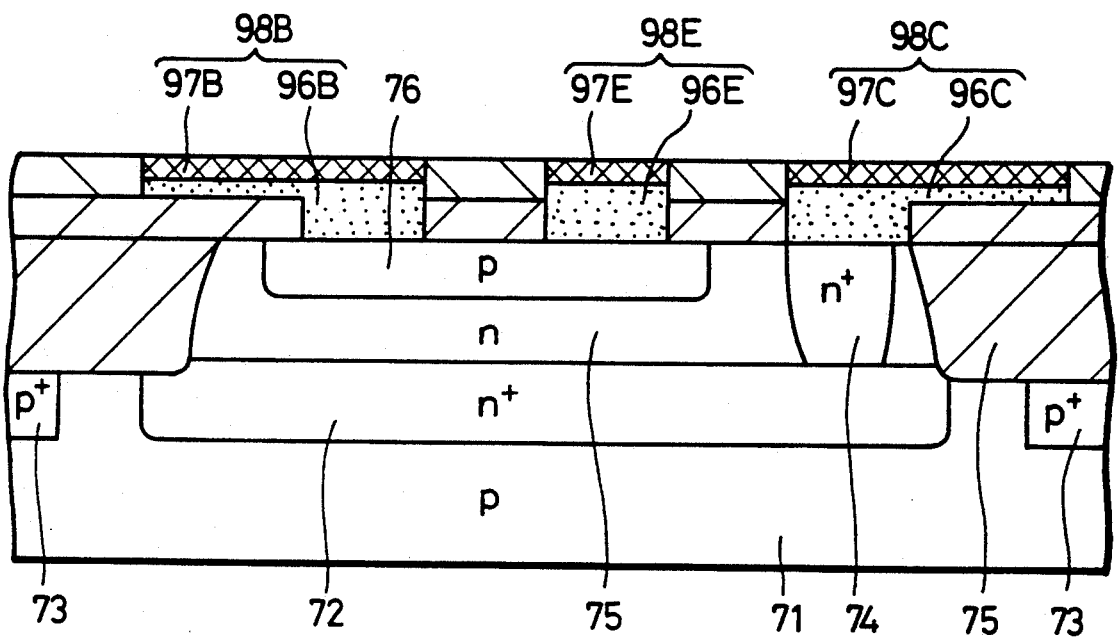
FIGS. 7A and 7B are respectively manufacturing process diagrams showing another example where the second embodiment is applied to manufacture a bipolar transistor.
Figure 7B:
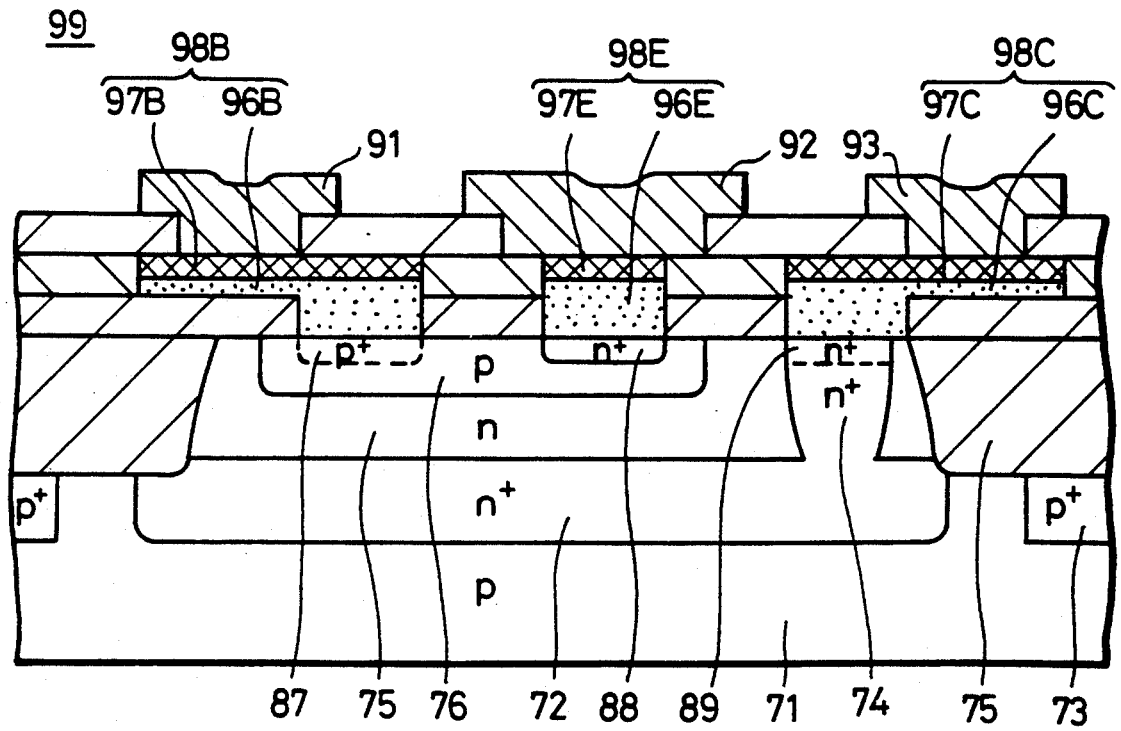

Incidentally, the respective lead-out electrodes 85E, 85B, 85C are formed only by the polycrystalline silicon film 85 in the embodiment shown in FIGS. 6A through 6G. However, it is alternatively possible to form the base lead-out electrode, the emitter lead-out electrode and the collector lead-out electrode by using a polycide film 98 (98E, 98B, 98C) composed of a polycrystalline silicon film 96 (96E. 98B, 96C) and a metal silicide film 97 (97E, 97B, 97C), as shown in FIGS. 7A and 7B. According to the thus constructed bipolar transistor 99, it is possible to reduce parasitic resistances of the respective leadout electrodes and make the thickness of the polycrystalline silicon film 96 appropriately thin, thereby decreasing the accumulation of holes in the polycrystalline silicon film 96E in the emitter lead-out electrode from the base region 76 and accordingly, reducing a so-called diffusion capacitance (accordingly, a capacitance between the emitter and the base).

While the embodiment shown in FIGS. 6A to 6G is applied to the symmetrical npn transistor, a pnp transistor can also be formed similarly.

Figure 8:
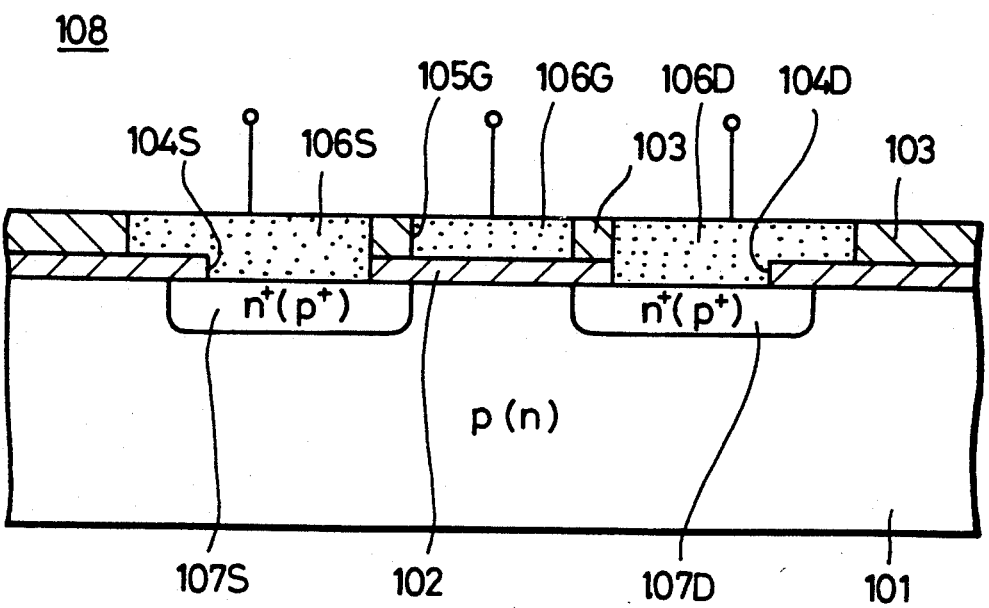
FIG. 8 is a cross-sectional view illustrating a further example wherein the second embodiment is applied to manufacture a MISFET.

FIG. 8 illustrates an example where the above-mentioned method is applied to a MISFET. An SiO$_2$ film 102 which is to constitute a gate insulating film is formed on a silicon substrate 101 of a first conductivity type, and an Si$_3$N$_4$ film 103 is formed thereon. Then, stepped opening portions 104S. 104D, which are horizontally symmetric, are formed at an interval corresponding to a gate length, and the Si$_3$N$_4$ film 103 on a gate portion only is selectively removed to form an opening 105G. Next, a polycrystalline silicon film 106 is formed over the entire surface, the surface is made flat and polycrystalline silicon films 106S, 106D and 106G are buried in the stepped opening portions 104S, 104D and the opening 105G, respectively. Then, a second conductivity type impurity is ion-implanted into the respective polycrystalline silicon films 106S, 106D and 106G, and an annealing treatment is performed, whereby a source region 107S and a drain region 107D are formed by an impurity diffusion from the polycrystalline silicon films 106S and 106D formed in the stepped opening portions 104S and 104D. Then, the respective polycrystalline silicon films 106S, 106D and 106G are made to constitute a source lead-out electrode, a drain lead-out electrode and a gate lead-out electrode, respectively, to complete a MISFET 108. This MISFET 108 can reduce contact widths of the source lead-out electrode 106S and the drain lead-out electrode 106D, thereby the bipolar transistor being densified more.

According to the method of manufacturing the semiconductor device of the present invention shown in FIG. 4, since the polycide film is employed as the lead-out electrode, the high speed operation of the device can be achieved and the metal diffusion from the polycide film can be suppressed, which results in preventing a metal pollution in the active region and a separation between the polycide film and the insulating film formed thereon. Accordingly, it is possible to manufacture a semiconductor device of high performance and high reliability.

According to the method of manufacturing the semiconductor device of the second invention, since the stepped opening portions are formed in which the conductors are buried so as to serve as the lead-out electrodes, contact widths of the lead-out electrodes can be reduced up to the limit of the lithography, thereby making it possible to readily manufacture a semiconductor device of high performance and high reliability.

Having described the preferred embodiments of the invention with reference to the accompanying drawings, it is to be understood that the invention is not limited to those precise embodiments and that various changes and modifications thereof could be effected by one skilled in the art without departing from the spirit or scope of the invention as defined in the appended claims.

What is claimed is:

1. A method of manufacturing a semiconductor device comprising the steps of:
    (a) forming a first insulating film (21) onto a semiconductor substrate (6a) of a first conductivity type;
    (b) forming a first opening through an insulating film (21);
    (c) forming a first polycrystalline silicon film (22) and silicide film (23) sequentially formed onto said semiconductor substrate (6a) including said opening;
    (d) forming a second insulating film (9) over said semiconductor substrate;
    (e) forming a second opening portion (10) inside the region of said first opening through said second insulating film (9), said first polycrystalline silicon film (22) and silicide film (23) so as to expose said semiconductor substrate;
    (f) forming a third insulating film (59) formed by a chemical vapor deposition process, which covers the side surface of said first polycrystalline silicon film (22), side surface of said silicide film (23) and side surface of said second insulating film (9) and the surface of said semiconductor substrate (6a);
    (g) implanting ions (58) of a second conductivity type into said semiconductor substrate (6a) through said third insulating film (59); and
    (h) forming an insulating side wall (12) on the side surface of said second opening (10).

2. The method of manufacturing a semiconductor device according to claim 1, further comprising the steps of:
    ((a) forming a second polycrystalline silicon film (13) in a third opening (28) restricted by said insulating side wall (12); and
    (b) diffusing an impurity from said first polycrystalline silicon film (22) and second polycrystalline silicon film (13) into said semiconductor substrate (6a).

* * * * *